United States Patent
Gill et al.

(10) Patent No.: US 9,054,155 B2
(45) Date of Patent: Jun. 9, 2015

(54) SEMICONDUCTOR DIES HAVING SUBSTRATE SHUNTS AND RELATED FABRICATION METHODS

(71) Applicants: Chai Ean Gill, Chandler, AZ (US); Wen-Yi Chen, Chandler, AZ (US)

(72) Inventors: Chai Ean Gill, Chandler, AZ (US); Wen-Yi Chen, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 14 days.

(21) Appl. No.: 13/789,340

(22) Filed: Mar. 7, 2013

(65) Prior Publication Data
US 2014/0252552 A1 Sep. 11, 2014

(51) Int. Cl.
H01L 27/02 (2006.01)
H01L 21/76 (2006.01)
H01L 21/761 (2006.01)

(52) U.S. Cl.
CPC .......... H01L 21/761 (2013.01); H01L 27/0251 (2013.01)

(58) Field of Classification Search
CPC . H01L 27/106; H01L 27/13; H01L 21/76264; H01L 21/84
USPC .......... 257/501, 347, 774, E21.564, E21.703, 257/E27.001, E27.081, E27.112, E27.11, 257/546; 438/420
See application file for complete search history.

(56) References Cited

U.S. PATENT DOCUMENTS

| | | | |
|---|---|---|---|
| 6,245,600 B1 | 6/2001 | Geissler et al. | |
| 7,820,519 B2 | 10/2010 | Roggenbauer et al. | |
| 8,188,543 B2 | 5/2012 | Roggenbauer et al. | |
| 2008/0247101 A1 | 10/2008 | Salman et al. | |
| 2010/0200960 A1 | 8/2010 | Angyal et al. | |
| 2011/0212595 A1* | 9/2011 | Hu et al. | 438/430 |
| 2012/0108045 A1* | 5/2012 | Morris | 438/516 |
| 2013/0153916 A1* | 6/2013 | Weyers et al. | 257/73 |
| 2013/0285196 A1* | 10/2013 | Dissegna et al. | 257/509 |
| 2014/0070367 A1* | 3/2014 | Kawase et al. | 257/532 |

* cited by examiner

Primary Examiner — Julio J Maldonado
Assistant Examiner — Moazzam Hossain
(74) Attorney, Agent, or Firm — Ingrassia Fisher & Lorenz, P.C.

(57) ABSTRACT

Die structures for electronic device packages and related fabrication methods are provided. An exemplary die structure includes a substrate having a first layer of semiconductor material including a semiconductor device formed thereon, a handle layer of semiconductor material, and a buried layer of dielectric material between the handle layer and the first layer. The die structure also includes a plurality of shunting regions in the first layer of semiconductor material, wherein each shunting region includes a doped region in the first layer that is electrically connected to the handle layer of semiconductor material, and a body region underlying the doped region that is contiguous with at least a portion of the first layer underlying a semiconductor device.

19 Claims, 6 Drawing Sheets

SEMICONDUCTOR DIES HAVING SUBSTRATE SHUNTS AND RELATED FABRICATION METHODS

TECHNICAL FIELD

Embodiments of the subject matter described herein relate generally to semiconductor devices and related fabrication methods, and more particularly, to protecting semiconductor devices from electrostatic discharge by providing shunts that are distributed throughout a semiconductor die.

BACKGROUND

Modern electronic devices, and particularly, integrated circuits, are at risk of damage due to electrostatic discharge (ESD) events. During an ESD event, a voltage may be provided to one or more terminals of an electronic device that exceeds the design voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

Charged Device Model (CDM) testing is used to simulate an ESD event where the device carries an electrostatic charge and discharges due to contact with one of the terminals of the device. In some situations, the ESD protection circuitry may not adequately protect the core device circuitry from the relatively high peak current and/or voltage transients occurring during a CDM-type ESD event. When core device circuitry is damaged during ESD testing, substantial analysis and modifications to the core device circuitry are often required to adequately address the ESD event, which, in turn, increases development costs.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which may be illustrated for simplicity and clarity and not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to semiconductor dies that include shunting regions that are distributed throughout the die and electrically connected to the substrate (or alternatively, the substrate voltage) to provide resistive paths between the substrate and the body semiconductor material underlying semiconductor devices fabricated on the die. By providing multiple resistive paths which are effectively in parallel between the substrate and the body regions, the effective substrate resistance across the die is thereby reduced. As a result, a greater percentage of the current during a CDM-type discharge event flows through the shunting regions to/from the substrate, thereby reducing the percentage of the discharge current through (or the voltage across) the semiconductor devices. As described in greater detail below, in some embodiments, the shunting regions are formed in the upper (or active) layer of a silicon-on-insulator (SOI) substrate and electrically connected to the handle layer of the SOI substrate, with the shunting regions being adjacent to semiconductor devices formed in the upper layer of the SOI substrate. An upper portion of a respective shunting region is laterally isolated from an adjacent semiconductor device by a shallow isolation region, while the underlying body region of the shunting region is integral with the body region underlying an adjacent semiconductor device. As a result, when the electrical potential (or voltage) of the body of an adjacent semiconductor device increases during an ESD event, a portion of that electrical potential (and thereby, a corresponding portion of the discharge current) is distributed through the body portion of the adjacent shunting region and to the handle layer via that adjacent shunting region, thereby reducing the voltage difference across electrodes of the semiconductor device.

Figure 1:
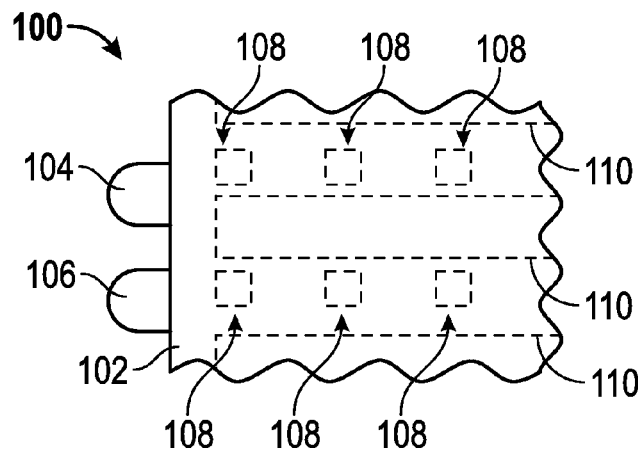
FIG. 1 is a partial top view of a device package in accordance with one embodiment of the invention.

Turning now to FIG. 1, in an exemplary embodiment, a device package 100 (or integrated circuit) includes a semiconductor die structure 102 and a plurality of input and/or output interfaces 104, 106. The semiconductor die structure 102 includes one or more device regions 110 having one or more semiconductor devices fabricated thereon, such as, for example, transistors, diodes, memory elements, sensors, or the like. In exemplary embodiments, the semiconductor die structure 102 is realized as a diced portion of a SOI substrate (or wafer) that includes an upper (or active) layer of semiconductor material having the semiconductor devices formed therein that overlies a buried layer of dielectric material, which, in turn, overlies a handle layer of semiconductor material, as described in greater detail below. The semiconductor devices fabricated on the semiconductor die 102 may be interconnected or otherwise configured to provide a desired functionality for the device package 100, as will be appreciated in the art. The I/O interfaces 104, 106 generally represent the physical interfaces for creating electrical connections to the semiconductor devices and/or any other components on the die 102 for transmitting electrical signals between the components on the die 102 and one or more external electrical components or systems.

It should be understood that FIG. 1 is a simplified representation of the device package 100 and the die structure 102 for purposes of explanation, and is not intended to limit the subject matter described herein in any way. In this regard, the semiconductor devices formed on the device regions 110 (and their various physical features) are not depicted in FIG. 1 because the subject matter described herein is not limited to any particular type or configuration of semiconductor devices fabricated on the device regions 110 of the die structure 102. However, for purposes of explanation, the subject matter may be described herein in the context of one or more transistor devices being fabricated on the device regions 110. In practice, the semiconductor die structure 102 may include any number or combination of semiconductor devices and/or device regions 110 arranged with any sort of layout or floorplan. Additionally, although FIG. 1 depicts the I/O interfaces 104, 106 as pins that protrude or otherwise extend from the device package 100, in other embodiments, the I/O interfaces 104, 106 may be realized as any sort of lead, pad, terminal, wire, or other physical interfaces capable of establishing an electrical connection to the components on the die 102. That is, the I/O interfaces 104, 106 are not limited to any particular type or configuration of terminals or interconnections. For example, the I/O interfaces 104, 106 may be realized as separate pads formed in a surface of the semiconductor die structure 102 or separate lead portions of a lead frame (e.g., for a flat no-leads device package 100).

Still referring to FIG. 1, in exemplary embodiments, the semiconductor die 102 includes a plurality of shunting regions 108 that are distributed throughout the semiconductor die 102 among the semiconductor devices and/or device regions 110 to provide resistive paths between a substrate reference voltage for the semiconductor die 102 and body regions of the active layer that underlie the semiconductor devices on the device regions 110. In exemplary embodiments, each of the shunting regions 108 is electrically connected to the handle layer of the die 102 to provide a resistive path from/to the body regions of the semiconductor device(s) adjacent to that respective shunting region 108 to/from the substrate reference voltage. For example, the first interface 104 of the device package 100 may be electrically connected to an electrode terminal of one or more of the semiconductor devices on the device region 110 of the die 102 while the second interface 106 of the device package 100 is configured to receive the substrate reference voltage and is electrically connected to the handle layer of semiconductor material for the die 102. Depending on the embodiment and the type of semiconductor device(s) formed on the device region(s) 110, the electrode terminal may be realized as a gate terminal, a drain terminal, a source terminal, a base terminal, a collector terminal, an emitter terminal, an anode terminal, a cathode terminal, or the like. The shunting regions 108 may be electrically connected to the substrate interface 106 at an edge of the die 102, and thereby, electrically connected to the handle layer of semiconductor material and/or the substrate reference voltage. In exemplary embodiments, the density of shunting regions 108 (i.e., the number of shunting regions per unit of die area) is chosen based on a desired amount of ESD protection, which may vary depending on the needs of a particular application. In accordance with one or more embodiments, the shunting regions 108 are substantially identical to one another and spaced equidistant from neighboring shunting regions 108 so that they are uniformly (or evenly) distributed throughout the die 102. In other embodiments, the shunting regions 108 may be different from one another (e.g., occupying different amounts of die area per shunting region) and/or be distributed non-uniformly throughout the die 102 (e.g., to accommodate various floorplans or layouts). For example, multiple shunting regions 108 may be aligned in a row (or column) adjacent to one another so that underlying body regions of semiconductor material of adjacent shunting regions 108 are contiguous with one another, in a similar manner as described in greater detail below in the context of the shunting region 408 and the device regions 410 of FIGS. 4-8.

Figure 2:
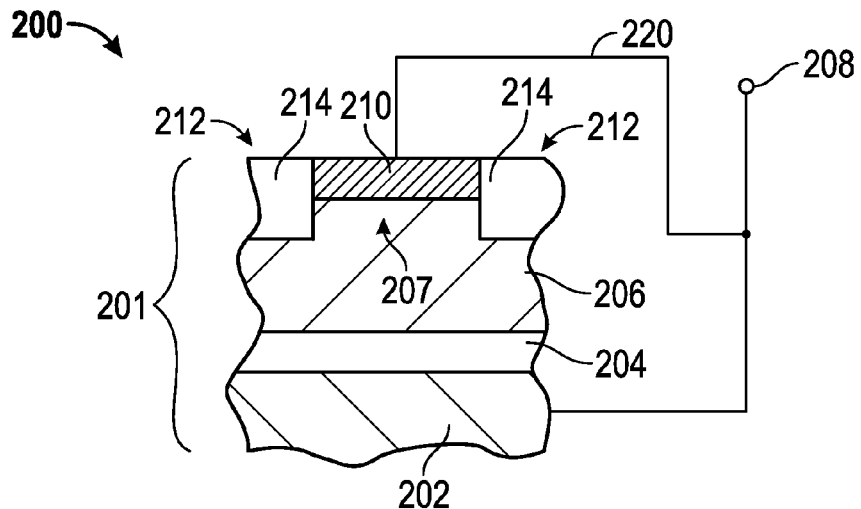
FIG. 2 is a cross-sectional view of one embodiment of a shunting region suitable for use in the device package of FIG. 1 in accordance with one or more embodiments.

FIG. 2 depicts an exemplary embodiment of a shunting region 200 suitable for use as one or more of the shunting regions 108 on the semiconductor die 102 encapsulated in the device package 100 of FIG. 1. The shunting region 200 includes a doped contact region 210 formed in an upper (or active) layer of semiconductor material 206 of a semiconductor substrate 201, with the doped contact region 210 being circumscribed or otherwise laterally enclosed by an isolation region 212 of dielectric material 214 formed in the upper layer of semiconductor material 206. The substrate 201 includes a handle layer of semiconductor material 202 that is isolated from the upper layer of semiconductor material 206 by a buried layer of dielectric material 204 that overlies the handle layer of semiconductor material 202. As described above in the context of FIG. 1, the handle layer of semiconductor material 202 is electrically connected to a device package interface 208 (e.g., interface 106 of device package 100) to receive a reference voltage for the substrate 201. As illustrated in FIG. 2, for some instances of the shunting region 200, an electrical connection 220 is provided (e.g., using overlying metallization and/or layers) between the shunting contact region 210 and the handle layer of semiconductor material 202, for example, by providing the electrical connection 220 between the shunting contact region 210 and the package interface 208, so that the shunting contact region 210 is electrically connected to the handle layer of semiconductor material 202 and/or the substrate reference voltage at the package interface 208 via the electrical connection 220. In practice, a plurality of shunting regions 200 may be distributed throughout a die, wherein some instances of the shunting region 200 may be electrically connected to one another via the underlying body region 207 of semiconductor material 206 being contiguous among the adjacent shunting regions 200, in which case not all of the instances of the shunting region 200 include an external electrical connection (e.g., electrical connection 220) to its contact region 210.

In exemplary embodiments, the shunting contact region 210 is realized as a doped region of the upper layer of semiconductor material 206 having a dopant concentration that is greater than a dopant concentration of the underlying body region 207 of semiconductor material 206. For example, as described in greater detail below, in accordance with one or more embodiments, the upper layer of semiconductor material 206 is realized as in-situ doped epitaxially grown silicon material having a dopant concentration less than about $1\times10^{17}/cm^3$, and in some embodiments, in the range of about $1\times10^{15}/cm^3$ to about $5\times10^{15}/cm^3$. The shunting contact region 210 is realized by implanting ions having a dopant concentration greater than about $1\times10^{18}/cm^3$ into the exposed portion of the semiconductor material 206 that is circumscribed by the isolation region 212. In some embodiments, the dopant concentration of the shunting contact region is in the range of about $1\times10^{19}/cm^3$ to about $1\times10^{21}/cm^3$. In exemplary embodiments, the shunting contact region 210 has the same conductivity type as the underlying body region 207 of semiconductor material 206. In alternative embodiments, the conductivity of the shunting contact region 210 may be opposite that of the underlying body region 207 of semiconductor material 206.

As described in greater detail below, the isolation region 212 is realized as a shallow isolation region that is formed by shallow trench isolation (STI) or another suitable isolation process so that the depth of the isolation region 212 relative to the upper surface of the substrate 201 is less than the thickness of the upper layer of semiconductor material 206. In exemplary embodiments, the depth of the shunting contact region 210 after diffusion is less than or equal to the depth of the shallow isolation region 212, so that the shallow isolation region 212 laterally encloses the shunting contact region 210 to laterally isolate the shallow isolation region 212 from adjacent semiconductor devices. For example, as described in greater detail below, in accordance with one or more embodiments, the depth of the shallow isolation region 212 is in the range of about 0.05 microns to about 1 micron, and more preferably, within the range of 0.2 microns to 0.5 microns, while the depth of the shunting contact region 210 is in the range of about 0.05 microns to about 0.3 microns. In this regard, the shunting contact region 210 is located at or near the surface of the upper layer of semiconductor material 206. In accordance with one or more embodiments, the shunting contact region 210 is formed concurrently to forming an electrode contact region for one or more semiconductor devices fabricated on the semiconductor substrate, as described in greater detail below. By virtue of the relatively high resistivity of the underlying semiconductor material 206 in combination with the depth of the shunting contact region 210 being less than the depth of the shallow isolation region 212, the shunting region 200 does not undesirably impact performance of adjacent semiconductor devices during normal operation (e.g., in the absence of an ESD event).

Figure 3:
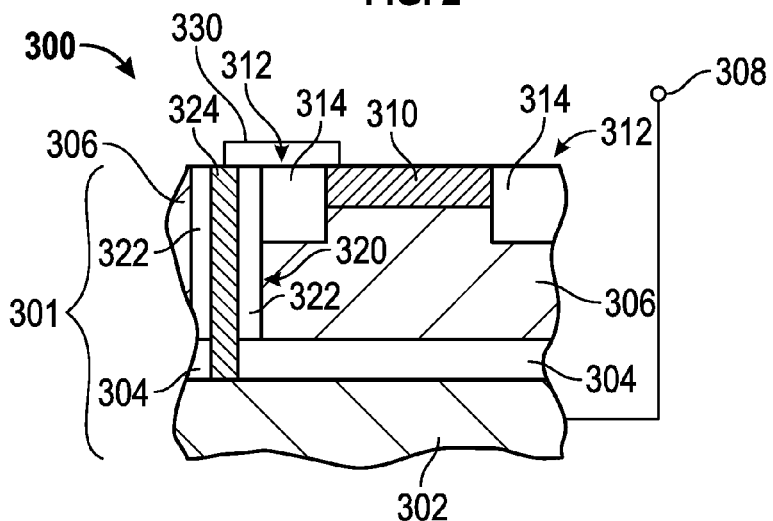
FIG. 3 is a cross-sectional view of another embodiment of a shunting region suitable for use in the device package of FIG. 1 in accordance with one or more embodiments.

FIG. 3 depicts another embodiment of a shunting region 300 suitable for use as one or more of the shunting regions 108 on the semiconductor die 102 encapsulated in the device package 100 of FIG. 1. In a similar manner as described above in the context of the shunting region 200 of FIG. 2, the shunting region 300 includes a doped contact region 310 having a dopant concentration that is greater than the dopant concentration of the upper layer of semiconductor material 306 of the semiconductor substrate 301, and the doped contact region 310 is circumscribed or otherwise laterally enclosed by a shallow isolation region 312 of dielectric material 314 having a depth relative to the upper surface of the substrate 301 that is less than the thickness of the upper layer of semiconductor material 306 but greater than the depth of the doped contact region 310.

In the embodiment of FIG. 3, a deep isolation region 320 is formed or otherwise provided within the shunting region 300, wherein the deep isolation region 320 includes an interior (or inner) region of conductive material 324 that is circumscribed or otherwise laterally enclosed by a region of dielectric material 322. The depth of the conductive material 324 of the deep isolation region 320 is greater than or equal to the combined thickness of the upper layer of semiconductor material 306 and the buried layer of dielectric material 304 so that the conductive material 324 extends through an opening in the buried layer of dielectric material 304 to contact or otherwise abut the handle layer of semiconductor material 302. Thus, the conductive material 324 of the deep isolation region 320 is electrically connected to the handle layer of semiconductor material 302. As illustrated in FIG. 3, an electrical connection 330 is provided (e.g., using overlying metallization and/or via layers) between the shunting contact region 310 and the conductive material 324, so that the shunting contact region 310 is electrically connected to the handle layer of semiconductor material 302 and/or the substrate reference voltage at the package interface 308 via the conductive material 324.

As described in greater detail below, in accordance with one or more embodiments, the conductive material 324 is realized as a doped semiconductor material having a dopant concentration that is greater than the dopant concentration of the upper layer semiconductor material 306 and greater than the dopant concentration of the handle layer semiconductor material 302 to provide a relatively low resistance path to the handle layer semiconductor material 302. For example, in one embodiment, the dopant concentration of the conductive material 324 is greater than about $1\times10^{17}/cm^3$, while the dopant concentration of the upper layer of semiconductor material 306 is in the range of about $1\times10^{15}/cm^3$ to about $1\times10^{17}/cm^3$, and the dopant concentration of the handle layer of semiconductor material 302 is in the range of about $1\times10^{15}/cm^3$ to about $1\times10^{17}/cm^3$. In some embodiments, the dopant concentration of the conductive material 324 is in the range of about $1\times10^{19}/cm^3$ to about $1\times10^{21}/cm^3$. In one or more embodiments, the dopant concentration of the conductive material 324 is also less than the dopant concentration of the contact region 310. In exemplary embodiments, the conductive material 324 has the same conductivity type as the handle layer semiconductor material 302.

Referring to again to FIG. 1 and with reference to FIGS. 2-3, in some embodiments, the semiconductor die structure 102 may include one or more instances of the shunting region 200 in combination with one or more instances of the shunting region 300. For example, a shunting region 108 at an interior location within the semiconductor die structure 102 may be realized as shunting region 300 with one or more shunting regions 108 adjacent to and/or proximate that shunting region being realized as shunting region 200, with the electrical connection 220 being provided between those respective instances of shunting region 200 and the shunting contact region 310 of that interior instance of the shunting region 300 rather than connecting those instances of shunting region 200 at the edge of the semiconductor die structure 200. Again, practical embodiments of the semiconductor die structure 102 may include any number or combination of shunting region 200 and shunting region 300 to suit the needs of a particular device package and/or floorplan.

FIGS. 4-8 illustrate methods for fabricating an exemplary semiconductor die structure 400 suitable for use as the semiconductor die 102 in the device package 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. As described above in the context of FIG. 1, in practice, the semiconductor die structure 400 may include multiple different semiconductor devices fabricated on a device region 410; however, for clarity and ease of explanation, and without limitation, the subject matter may be described herein using the singular form when referring to a semiconductor device fabricated on the device region 410 of the semiconductor die structure 400. Furthermore, while FIGS. 4-8 depict the fabrication of the shunting region 300 of FIG. 3, fabrication of the shunting region 200 of FIG. 2 may be achieved in an equivalent manner but without the fabrication of the deep isolation region 420 (or the connection thereto) described below in the context of FIGS. 6 and 8.

Figure 4:
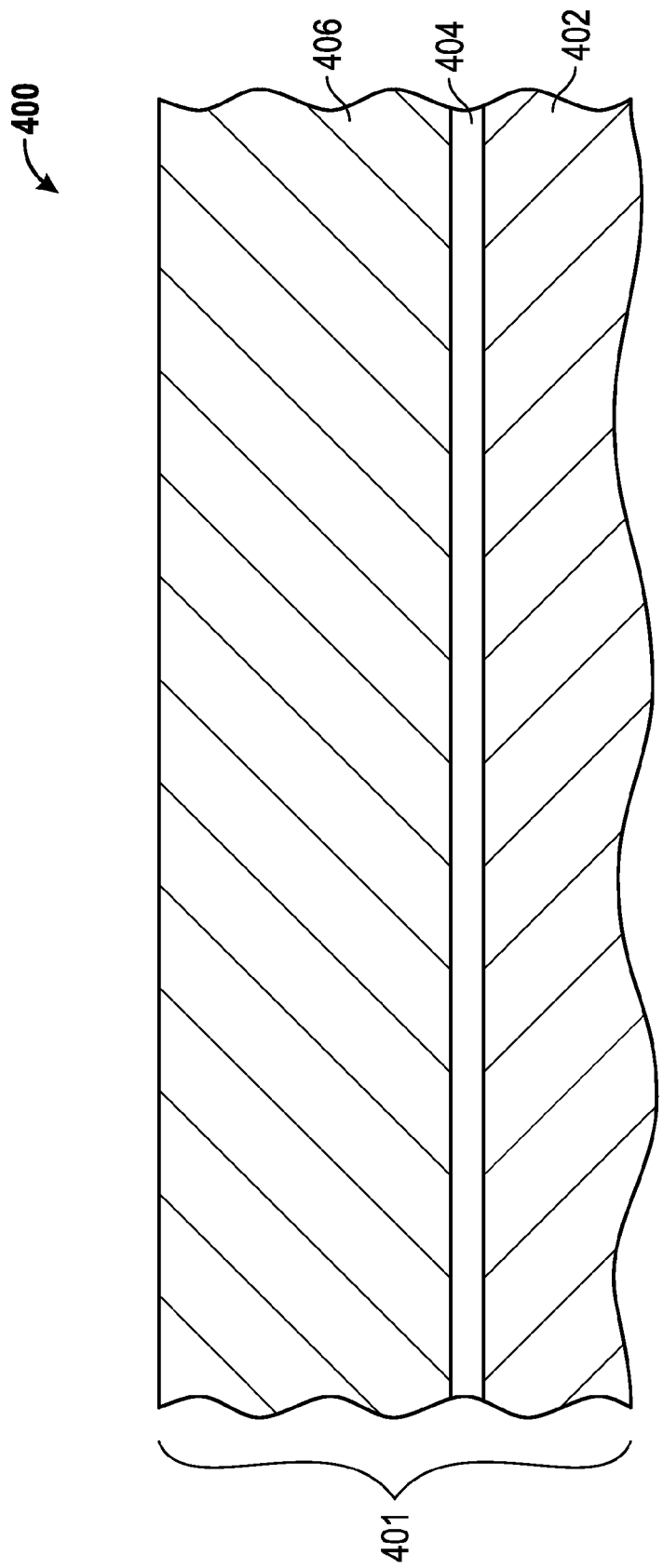
FIGS. 4-8 illustrate, in cross section, exemplary methods for fabricating a semiconductor die structure including a shunting region in accordance with one or more embodiments of the invention.

Referring now to FIG. 4, in exemplary embodiments, the die structure 400 is fabricated from a SOI substrate 401 having a handle (or support) layer of semiconductor material 402, a buried layer of dielectric material 404 on or otherwise overlying the handle layer semiconductor material 402, and an upper layer of semiconductor material 406 on or otherwise overlying the buried layer semiconductor material 404. As described in greater detail below, in exemplary embodiments, the upper layer semiconductor material 406 is utilized to fabricate semiconductor devices thereon, and accordingly, for convenience, but without limitation, the upper layer may alternatively be referred to herein as the active layer. In an exemplary embodiment, the semiconductor material 402, 406 of each of the layers is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers of semiconductor material 402, 406 may be realized as germanium, gallium arsenide, and the like, and/or one or more of the layers of semiconductor material 402, 406 may include layers of different semiconductor materials. In accordance with one embodiment, the buried layer 404 is realized as an oxide layer formed in a subsurface region of the semiconductor substrate 401, also known as a buried oxide (BOX) layer. For example, the buried layer dielectric material 404 may be formed by oxidizing a wafer of semiconductor material which is then bonded to another wafer or layer of semiconductor material to provide a buried layer of oxide material between a handle layer 402 and an active layer 406. In exemplary embodiments, the handle layer 402 and the active layer 406 are each lightly doped. For example, the active layer 406 may be realized as an in-situ doped epitaxially-grown silicon material having a dopant concentration in the range of about $1 \times 10^{15}/cm^3$ to about $5 \times 10^{15}/cm^3$, while the handle layer 402 is realized as a silicon material having a dopant concentration in the range of about $1 \times 10^{15}/cm^3$ to about $5 \times 10^{15}/cm^3$. In one embodiment, the active layer semiconductor material 406 is realized as P-type epitaxial silicon material and the handle layer 402 is realized as N-type silicon material. In alternative embodiments, the active layer semiconductor material 406 and the handle layer semiconductor material 402 may have the same conductivity type as one another, that is, the active layer semiconductor material 406 may be realized as an N-type epitaxial silicon material and/or the handle layer semiconductor material 402 may be realized as a P-type silicon material. That said, for purposes of explanation, the subject matter will be described herein in the context of a P-type active layer semiconductor material 406 and an N-type handle layer semiconductor material 402.

Figure 5:
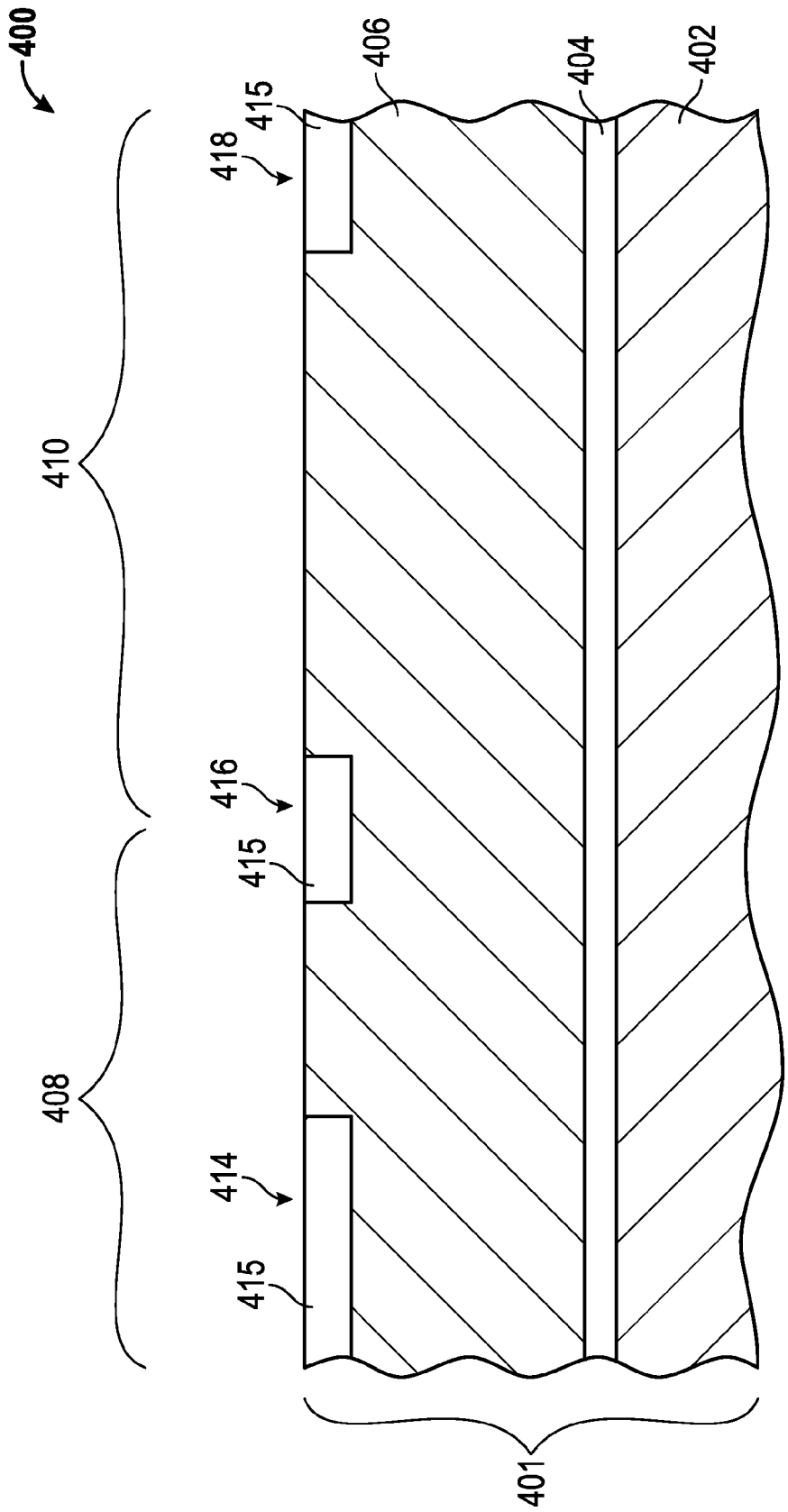
Figure 6:
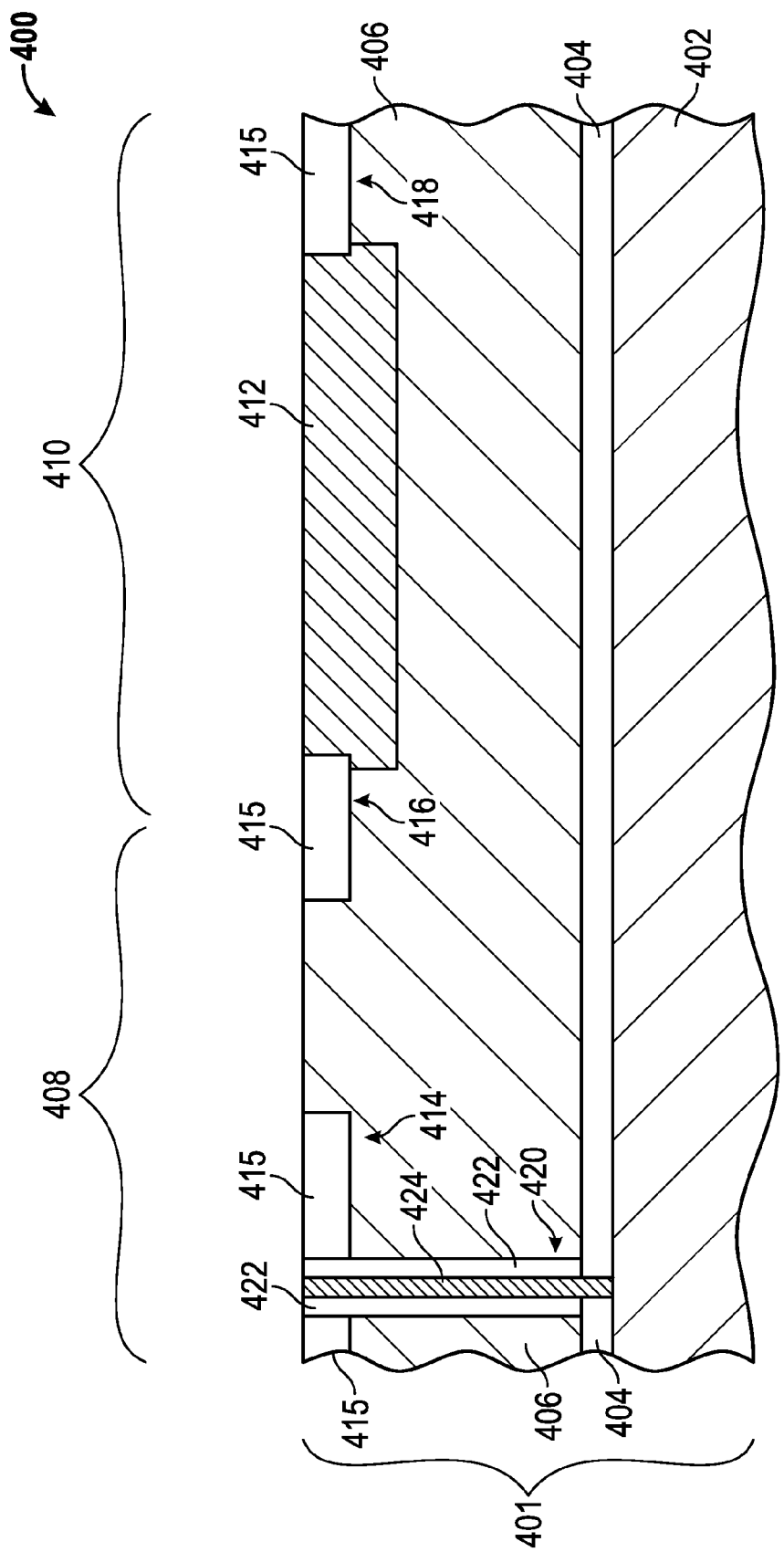

Referring now to FIGS. 5-6, in exemplary embodiments, fabrication of the die structure 400 continues by performing one or more fabrication process steps to form or otherwise fabricate one or more semiconductor devices (or components thereof) on a device region 410 of the substrate 401 adjacent to a shunting region 408 (e.g., shunting region 200 or shunting region 300). Various well known semiconductor fabrication process steps, such as photolithography, etching, ion implantation, deposition, and the like, may be performed to fabricate the semiconductor devices (or components thereof) on the device region 410 of the substrate 401. For example, the shunting region 408 and other portions of the active layer 406 may be masked with an implantation mask, and ions having a desired conductivity-determining impurity type and dopant concentration may be implanted in the active layer 406 using the implantation mask to form a well region 412 for a semiconductor device in the device region 410, such as a field-effect transistor (FET). For example, a P-type well region 412 for an N-type field-effect transistor may be formed by implanting P-type ions, such as boron ions, with a dopant concentration that is greater than the dopant concentration of the P-type epitaxial semiconductor material 406, and preferably in some embodiments, the dopant concentration of the P-well region 412 is within the range of about $1 \times 10^{16}/cm^3$ to about $1 \times 10^{19}/cm^3$.

In the illustrated embodiment, prior to forming the well region 412, shallow isolation regions 414, 416, 418 of a dielectric material 415 are formed in the upper portions of the shunting region 408 and the device region 410 by performing shallow trench isolation (STI). To form the shallow isolation regions 414, 416, 418, interior portions of the shunting region 408 and the device region 410 are masked with a masking material that is patterned to expose the active layer 406 about the periphery of the shunting region 408 and the device region 410. The exposed portions of the active layer 406 are then etched to a desired depth (which is less than the thickness of the active layer 406), and a dielectric material 415, such as an oxide material, may be deposited (or grown) to a thickness greater than or equal to a depth of the trenches to fill the trenches and subsequently planarized to obtain shallow isolation regions 414, 416, 418 having upper surfaces substantially aligned with the upper surfaces of the surrounding active layer 406. In accordance with one or more exemplary embodiments, the depth of the shallow isolation regions 414, 416, 418 is in the range of about 0.05 microns to about 1 micron, however, it will be appreciated that the depth of the shallow isolation regions 414, 416, 418 is not constrained to any particular depth (or range thereof) and the depth may be adjusted to suit the needs of a particular application and/or fabrication process.

Turning now to FIG. 6, after forming the shallow isolation regions 414, 416, 418, fabrication of the die structure 400 continues by performing deep trench isolation (DTI) to provide a deep isolation region 420 in the shunting region 408 that includes an outer dielectric material 422 and an inner conductive material 424 that extends through openings in the active layer 406 and the buried layer 404 to contact the handle layer 402 and establish an electrical connection between the inner conductive material 424 and the handle layer 402. The deep isolation region 420 is formed at or near an edge of the shunting region 408 in a manner that allows at least a portion of the active layer semiconductor material 406 of the shunting region 408 proximate or otherwise adjacent to the device region 410 to maintain contact or contiguity with the active layer semiconductor material 406 of the device region 410. Fabrication of the deep isolation region 420 may be achieved by masking the semiconductor substrate 401 with a masking material, patterning the masking material to expose the portion of the shallow isolation region 414 and/or active layer semiconductor material 406 to be utilized for the deep isolation region 420, etching the exposed portions of the shallow isolation region 414 and the active layer semiconductor material 406 using the remaining masking material as an etch mask to form a deep trench that exposes the underlying buried layer dielectric material 404. For example, a hard mask including a nitride material may be patterned and used as an etch mask while etching the exposed portions of the shallow isolation region 414 and the active layer semiconductor material 406 by reactive ion etching (RIE) with one or more anisotropic etchants and stopping on the buried layer dielectric material 404.

After forming the deep trench, fabrication of the deep isolation region 420 may continue by forming a layer of dielectric material 422 in the trench, for example, by oxidizing the exposed surfaces of the active layer semiconductor material 406 (e.g., by thermal oxidation or chemical oxidation) to grow a layer of oxide material on the exposed surfaces, or alternatively, by conformably depositing a layer of dielectric material 422 overlying the substrate 401. In exemplary embodiments, the dielectric material 422 is formed to a thickness in the range of about 200 nm to about 1000 nm, however, it will be appreciated that the thickness of the dielectric material 422 may be adjusted to provide a desired isolation or otherwise accommodate the voltage range for a particular application. In this regard, the dielectric material 422 may fill the deep trench only partially in some embodiments. After forming the dielectric material 422, fabrication of the deep isolation region 420 continues by anisotropically etching the dielectric material 422 and/or the exposed buried layer dielectric material 404 in the interior (or central) portion of the deep trench to form a voided region within the deep trench that extends through the buried layer 404 and exposes the underlying handle layer semiconductor material 402. After forming the voided region, fabrication of the deep isolation region 420 is completed by forming a layer of conductive material 424 in the voided region of the trench. The conductive material 424 abuts or otherwise contacts the handle layer semiconductor material 402 to provide an electrical connection to the handle layer semiconductor material 402. In accordance with one or more embodiments, the conductive material 424 is realized as a polysilicon material that is doped so that it has the same conductivity type as the underlying handle layer 402. For example, a layer of a polysilicon material or another conductive material may be conformably deposited overlying the substrate 401 by chemical vapor deposition (CVD) or another deposition process to a thickness chosen such that the conductive material 424 fills the voided region of the trench to a minimum thickness (or height) that meets or exceeds the thickness (or height) of the active layer 406 (e.g., a "flush" fill or overfill). In one or more exemplary embodiments, the conductive material 424 is in-situ doped with N-type ions, such as phosphorous ions, to provide a N-type conductive material 424 that contacts the N-type handle layer 402. In an exemplary embodiment, the dopant concentration of the conductive material 424 is greater than the dopant concentration of the handle layer 402, and preferably within the range of about $1\times10^{19}/cm^3$ to about $1\times10^{21}/cm^3$ to provide the electrical connection to the handle layer 402 with relatively low resistance.

After forming the conductive material 424, the fabrication process continues by planarizing the conductive material 424 and/or the dielectric material 422 (e.g., by chemical-mechanical planarization (CMP) or the like) to uniformly remove any excess portions of the conductive material 424 and/or the dielectric material 422 across the semiconductor substrate 401 until reaching the upper surface of the active layer semiconductor material 406. Thereafter, the shunting region 408 and other portions of the active layer 406 may be masked with an implantation mask while the well region 412 is formed in the device region 410 by implanting ions with a dopant concentration that is greater than the dopant concentration of the epitaxial semiconductor material 406 into the exposed epitaxial semiconductor material 406 between shallow isolation regions 416, 418 as described above, resulting in the die structure 400 of FIG. 6 after ion diffusion and removal of the implantation mask.

Figure 7:
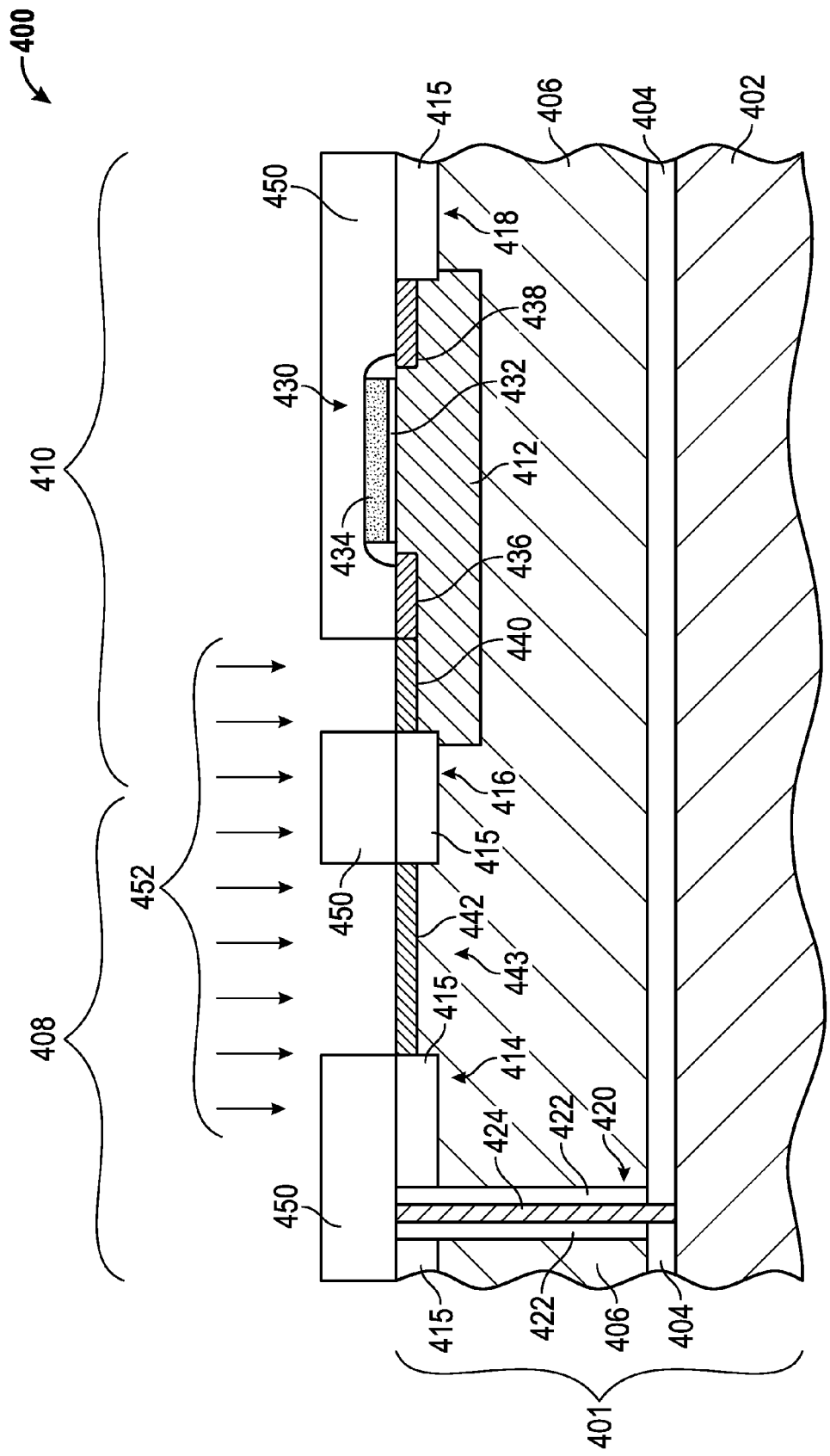

Referring now to FIG. 7, in an exemplary embodiment, the fabrication of the die structure 400 continues with various semiconductor device fabrication process steps being performed to fabricate one or more semiconductor devices on the device region 410. For example, a gate structure 430 for a transistor may be formed overlying at least an interior portion of the well region 412 in a conventional manner, for example, by forming a gate dielectric material 432 overlying the semiconductor substrate 401, forming a conductive gate electrode material 434 overlying the gate dielectric material 432, and anisotropically etching the gate dielectric material 432 and conductive gate electrode material 434 to form the gate structure 430. After forming the gate structure 430, fabrication of the transistor may continue by forming doped electrode contact regions 436, 438, 440 about the gate structure 430. In exemplary embodiments, concurrently to forming an electrode contact region 440 that has the same conductivity as the active layer semiconductor material 406, a doped contact region 442 is concurrently formed in an interior portion of the active layer 406 of the shunting region 408 between the shallow isolation regions 414, 416 to provide an electrical contact to the underlying body region 443 of active layer semiconductor material 406 of the shunting region 408 that is integral or otherwise contiguous with the body region (e.g., well region 412) of the active layer semiconductor material 406 of the device region 410. As described above and in greater detail below, the doped contact region 442 is utilized to electrically connect the active layer semiconductor material 406 of the shunting region 408 to the handle layer semiconductor material 402 (e.g., via the conductive material 424 of the deep isolation region 420 or another electrical connection), and thereby, provide a resistive path (or connection) to the global substrate reference voltage for the die structure 400. Accordingly, the doped contact region 442 may alternatively be referred to herein as the shunting contact region.

Still referring to FIG. 7, in the illustrated embodiment, for an N-type transistor having a P-type well region 412, N-type source and drain electrode contact regions 436, 438 may be formed in the P-well 412 proximate the gate structure 430 by masking the shunting region 408 and other portions of the device region 410 with an implantation mask that leaves exposed the portions of the P-well 412 adjacent to the gate structure 430 and implanting N-type ions, such as phosphorous ions, with a dopant concentration in the range of about $1\times10^{19}/cm^3$ to about $1\times10^{21}/cm^3$. After forming the N-type electrode contact regions, fabrication of the transistor may continue by removing the implantation mask used for the N-type implantation and forming P-type electrode contact regions, such as body electrode contact region 440 along with the shunting contact region 442. To form the P-type contact regions, the substrate 401 is masked with an implantation mask 450 that masks the gate structure 430 and the source/drain electrode contact regions 436, 438 and leaves exposed the remaining portions of the P-well region 412 along with the portions of the active layer 406 between the shallow isolation regions 414, 416 of the shunting region 408. The P-type contact regions are then formed by implanting P-type ions, illustrated by arrows 452, in the exposed portions of the P-well region 412 and active layer semiconductor material 406 using the implantation mask 450, resulting in the semiconductor die structure 400 of FIG. 7. The P-type contact regions 440, 442 may be formed by implanting P-type ions, such as boron ions, with a dopant concentration in the range of about $1\times10^{19}/cm^3$ to about $1\times10^{21}/cm^3$ at an energy level chosen so that the depth of the P-type contact regions 440, 442 is less than the depth of the shallow isolation regions 414, 416, 418. In this regard, the shunting contact region 442 is formed in the upper surface of the active layer of semiconductor material 406 and is effectively located at the surface of the active layer of semiconductor material 406, so that a portion of active layer semiconductor material 406 in the shunting region 408 remains between the shunting contact region 442 and the buried dielectric material 404. For purposes of explanation, the portion of the active layer semiconductor material 406 within the shunting region 408 that underlies the shunting contact region 442 may be referred to as the body region 443 (or body portion) of the shunting region 408. In some embodiments, the depth and dopant concentration of the P-type contact regions 440, 442 are be substantially same as the depth and dopant concentration of the N-type contact regions 436, 438 but with opposite conductivity. As illustrated in FIG. 7, the isolation region 416 resides between the shunting contact region 442 and the body electrode contact region 440 and the well region 412 and thereby laterally isolates the shunting contact region 442 from the body electrode 412, 440 and the other electrodes of the transistor device on the device region 410. After the P-type contact regions 440, 442 are formed, the fabrication of the die structure 400 may continue by removing the implantation mask 450 and performing additional front-end-of-line (FEOL) fabrication process steps to complete fabrication of the semiconductor devices on the device region 410.

Figure 8:
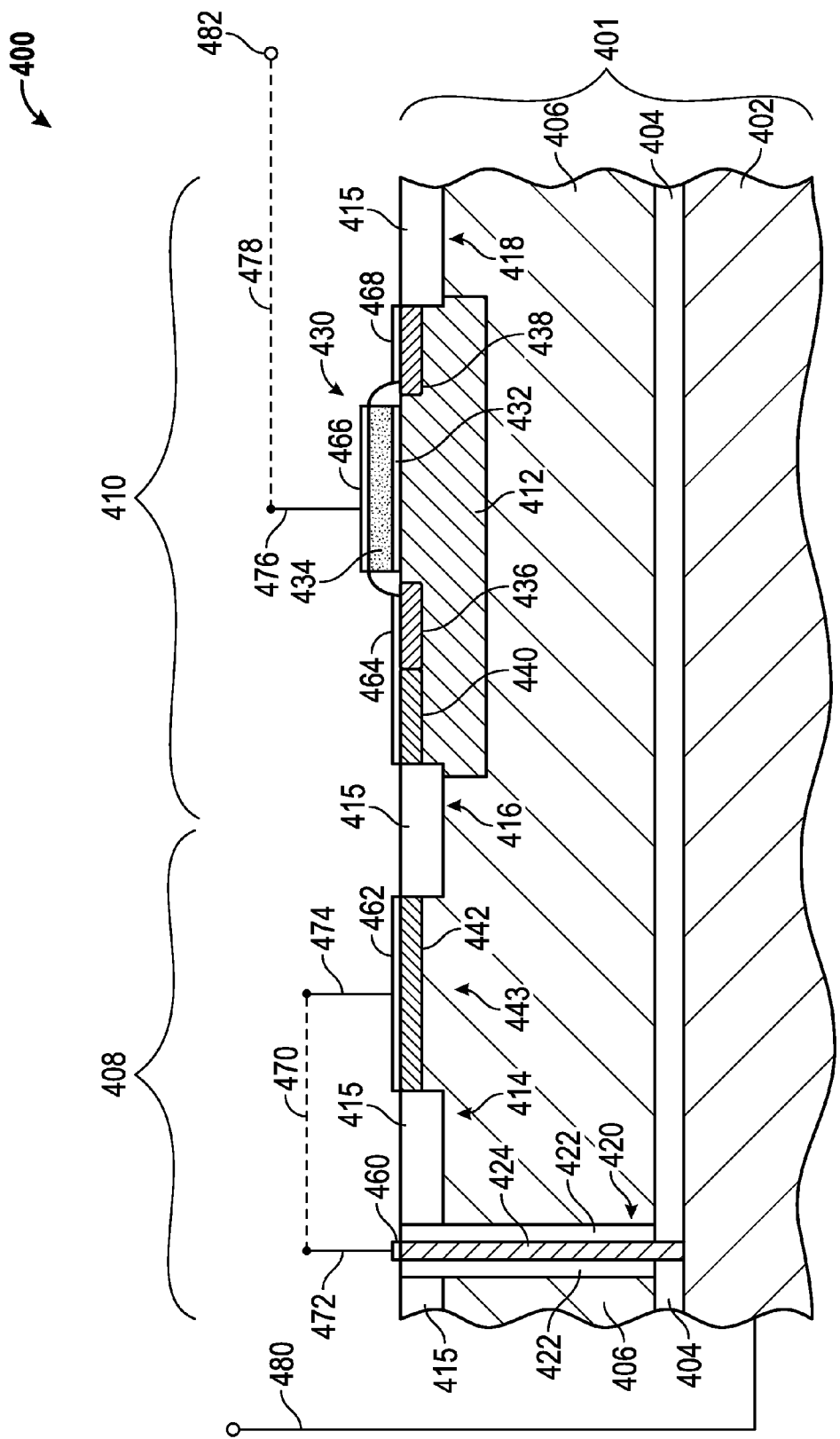

Referring now to FIG. 8, after the appropriate FEOL fabrication process steps have been performed to fabricate the desired semiconductor devices on the device region 410, fabrication of the die structure 400 continues by performing back-end-of-line (BEOL) fabrication process steps including forming contacts 460, 462 on the deep trench conductive material 424 and the shunting contact region 442 concurrently to forming contacts 464, 466, 468 on the gate structure 430 and the transistor electrode contact regions 436, 438, 440. In exemplary embodiments, the contacts 460, 462, 464, 466, 468 are realized as a metal silicide layer formed by conformably depositing a layer of silicide-forming metal onto the exposed surfaces of the contact regions 436, 438, 440, 442, the gate structure 430, and the conductive material 424 and heating the die structure 400, for example by rapid thermal annealing (RTA), to react the silicide-forming metal with the exposed silicon and form metal silicide contacts 460, 462, 464, 466, 468 at the top of the deep trench conductive material 424, the respective contact regions 436, 438, 440, 442, and the gate structure 430, with the unreacted silicide-forming metal being removed thereafter.

After forming contacts 460, 462, 464, 466, 468, fabrication of the die structure 400 continues by forming or otherwise providing electrical connections to/from the silicide contacts, for example, using interconnect layers (e.g., metallization and/or via layers) subsequently formed overlying the semiconductor die structure 400. In exemplary embodiments, the shunting contact region 442 is electrically connected (or shorted) to the substrate reference voltage and/or the handle layer semiconductor material 402, for example, by providing a conductive electrical connection 470 between the shunting region contact 462 and the deep trench contact 460. For example, terminals 472, 474, such as contact plugs, vias or the like, may be formed overlying the contacts 460, 462, and the connection 470 may be provided between the terminals 472, 474, for example, by forming the connection 470 using a conductive trace in an overlying metal interconnect layer. In this manner, by virtue of the electrical connection 470 and the contiguity of the active layer semiconductor material 406 between regions 408, 410, the shunting contact region 442 and the underlying body region 443 of active layer semiconductor material 406 provide a resistive connection (or path) from the body region of the active layer semiconductor material 406 of the device region 410 (e.g., well region 412 and/or its underlying/surrounding semiconductor material 406) to the handle layer semiconductor material 402. As described above in the context of FIG. 1-3, in exemplary embodiments, the handle layer 402 is electrically connected, at or near an edge of the die structure 400, to a device package interface 480 that is configured to receive a substrate reference voltage. In this manner, the shunting region 408 is effectively connected to the substrate reference voltage interface via the deep trench conductive material 424 and the electrical connection 470. It should be noted that for the embodiment of FIG. 2, where the shunting region 408 does not include a deep trench isolation region 420, rather than terminating at the deep trench contact terminal 472, the electrical connection 470 to the shunting region 408 may extend to an edge of the die structure 400, at which point, the electrical connection 470 may be routed or otherwise configured to contact the handle layer 402 and/or the substrate reference voltage interface 480 at or near the edge of the die structure 400.

In a similar manner, an electrode terminal of a semiconductor device in the device region 410 is electrically connected (or shorted) to an I/O interface 482 of a device package. For example, a terminals 476, such as a contact plug, a via or the like, may be formed overlying the gate electrode contact 466, and an electrical connection 478 may be provided between the gate electrode terminal 476 and the I/O device package interface 482, for example, by forming the connection 478 using a conductive trace in an overlying metal interconnect layer. By virtue of this connection any excess voltage at the I/O package interface 482 resulting from a CDM ESD event (e.g., a transient voltage that is not fully clamped by ESD protection circuitry coupled to the I/O package interface 482) is applied to the gate electrode, which in turn, may raise the voltage of the gate conductive material 434 relative to the voltage of the source electrode region 436 and/or the well region 412 and cause the transistor on the device region 410 to conduct current. In this regard, by virtue of the body region 443 of active layer semiconductor material 406 in the shunting region 408 that underlies the shunting contact region 442 being contiguous with the body region of active layer semiconductor material 406 of the device region 410 underlying the transistor, the shunting region 408 provides a resistive path to the handle layer 402 that conducts a percentage of the discharge current and thereby dissipates or otherwise distributes a percentage of the discharge voltage at the gate electrode. As a result, the voltage at the gate electrode (e.g., gate conductive material 434) relative to the source electrode (e.g., source contact region 436) is reduced, thereby reducing the proportion of the discharge current and/or voltage that is dissipated by the transistor and/or other semiconductor devices on the device region 410. As described above in the context of FIG. 1, by virtue of the plurality of shunting regions 108 being distributed throughout the die 102, the resistive paths between the active layer semiconductor material 406 and the handle layer semiconductor material 402 are effectively electrically in parallel with one another to further reduce the effective substrate resistance across the die structure 400, which, in turn, increases the percentage of the discharge current and/or voltage that is dissipated by the semiconductor substrate 401 (e.g., the active layer 406 and/or the handle layer 402) relative to the percentage of the discharge current and/or voltage that must be dissipated by the transistors and/or semiconductor devices on the device region 410. In this manner, the distributed shunting regions 108 protect adjacent or neighboring semiconductor devices on the device region 410 during an ESD event, particularly, during CDM-type voltage transients that may not be fully clamped by ESD protection circuitry due to the magnitude of the applied voltage pulse and/or the relatively short duration of the applied voltage pulse.

For the sake of brevity, conventional techniques related to semiconductor and/or integrated circuit fabrication, ESD protection, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

An apparatus for a die structure is provided in one embodiment. The die structure includes a substrate having a first layer of semiconductor material including a plurality of semiconductor devices formed thereon, a handle layer of semiconductor material, and a buried layer of dielectric material between the handle layer and the first layer, and a plurality of shunting regions in the first layer of semiconductor material. Each shunting region includes a doped region formed in the first layer and an underlying body region of the first layer, wherein the doped region is electrically connected to the handle layer of semiconductor material and the body region is contiguous with at least a portion of the first layer underlying a semiconductor device of the plurality of semiconductor devices, the body region underlying the doped region. In some embodiments, the doped region of each shunting region is laterally enclosed by an isolation region, wherein a depth of the doped region is less than a depth of the isolation region. In one or more embodiments, the isolation region resides between the doped region and an electrode of the semiconductor device. In accordance with one or more embodiments, a shunting region of the plurality of shunting regions includes a deep isolation region having a conductive material extending through an opening in the buried layer to contact the handle layer, wherein the conductive material is electrically connected to the doped region and the handle layer. In one or more embodiments, the dopant concentration of the first layer is less than $1\times10^{17}/cm^3$ and the dopant concentration of the doped region is greater than the dopant concentration of the first layer. In a further embodiment, a dopant concentration of the conductive material is greater than $1\times10^{17}/cm^3$ and a dopant concentration of the handle layer is less than the dopant concentration of the conductive material. In another embodiment, the doped region and the body region have the same conductivity type. In a further embodiment, the doped region and the handle layer have the opposite conductivity type.

In another embodiment, an apparatus for a device package is provided. The device package includes a first terminal, a second terminal, and a substrate. The substrate comprises a handle layer of semiconductor material, a buried layer of dielectric material overlying the handle layer, and a first layer of semiconductor material overlying the buried layer. The handle layer is electrically connected to the first terminal. The substrate also includes a device region including at least a first semiconductor device having an electrode electrically connected to the second terminal, and a plurality of shunting regions electrically connected to the handle layer, wherein at least a first portion of the first layer of semiconductor material of each shunting region is contiguous with at least a second portion of the first layer of semiconductor material of the device region. In one embodiment, each shunting region includes a doped region located at an upper surface of the first layer and electrically connected to the handle layer, wherein the first portion of the first layer of semiconductor material of the respective shunting region underlies the doped region. In a further embodiment, the second portion of the first layer of semiconductor material of the device region underlies the first semiconductor device. In another embodiment, each shunting region includes an isolation region between the doped region and the first semiconductor device, wherein the isolation region laterally isolates the doped region and a depth of the isolation region is greater than a depth of the doped region. In a further embodiment, the device package includes a deep isolation region in the substrate, wherein the deep isolation region includes a conductive material in contact with the handle layer, and the doped region is electrically connected to the conductive material. In yet another embodiment, the first layer comprises epitaxial semiconductor material having a dopant concentration that is less than $1\times10^{17}/cm^3$ and a dopant concentration of the doped region is greater than the dopant concentration of the epitaxial semiconductor material.

In accordance with another embodiment, a method is provided for fabricating a semiconductor device on a first layer of semiconductor material of a substrate that also comprises a handle layer of semiconductor material and a buried layer of dielectric material between the handle layer and the first layer. The method comprises forming a plurality of shunting regions in the first layer of semiconductor material, wherein each shunting region includes a first portion of the first layer that is contiguous with a second portion of the first layer underlying the semiconductor device and a doped region overlying the first portion, and providing an electrical connection between the handle layer and the plurality of shunting regions. In one embodiment, forming each shunting region comprises forming the doped region in an upper surface of the first layer. In a further embodiment, forming each shunting region further comprises forming, in the first layer, a deep isolation region including a conductive material in contact with the handle layer, and providing the electrical connection comprises providing the electrical connection between the doped region and the conductive material. In another embodiment, the method further comprises forming a shallow isolation region in the first layer, wherein the shallow isolation region laterally isolates the doped region from the semiconductor device.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A die structure comprising:
   a substrate having a first layer of semiconductor material including a plurality of semiconductor devices formed thereon, a handle layer of semiconductor material, and a buried layer of dielectric material between the handle layer and the first layer; and
   a plurality of shunting regions in the first layer of semiconductor material, wherein each shunting region includes:
      a doped region in the first layer, the doped region being electrically connected to the handle layer of semiconductor material; and
      a body region of the first layer, the body region being contiguous with at least a portion of the first layer underlying a semiconductor device of the plurality of semiconductor devices, the body region underlying the doped region.

2. The die structure of claim 1, wherein the doped region of each shunting region is laterally enclosed by an isolation region.

3. The die structure of claim 2, wherein a depth of the doped region is less than a depth of the isolation region.

4. The die structure of claim 2, wherein the isolation region resides between the doped region and an electrode of the semiconductor device.

5. The die structure of claim 1, wherein:
a shunting region of the plurality of shunting regions includes a deep isolation region having a conductive material extending through an opening in the buried layer to contact the handle layer; and
the conductive material is electrically connected to the handle layer and the doped region.

6. The die structure of claim 5, wherein:
a dopant concentration of the first layer is less than $1\times10^{17}/cm^3$; and
a dopant concentration of the doped region is greater than the dopant concentration of the first layer.

7. The die structure of claim 6, wherein:
a dopant concentration of the conductive material is greater than $1\times10^{17}/cm^3$; and
a dopant concentration of the handle layer is less than the dopant concentration of the conductive material.

8. The die structure of claim 1, wherein:
a dopant concentration of the first layer is less than $1\times10^{17}/cm^3$; and
a dopant concentration of the doped region is greater than the dopant concentration of the first layer.

9. The die structure of claim 1, wherein the doped region and the body region have the same conductivity type.

10. The die structure of claim 9, wherein the doped region and the handle layer have the opposite conductivity type.

11. A device package comprising:
a first terminal;
a second terminal;
a substrate comprising a handle layer of semiconductor material, a buried layer of dielectric material overlying the handle layer, and a first layer of semiconductor material overlying the buried layer, the handle layer being electrically connected to the first terminal, wherein the substrate includes:
a device region including at least a first semiconductor device having an electrode electrically connected to the second terminal; and
a plurality of shunting regions electrically connected to the handle layer, wherein at least a first portion of the first layer of semiconductor material of each shunting region is contiguous with at least a second portion of the first layer of semiconductor material of the device region, and wherein each shunting region includes a doped region located at an upper surface of the first layer and electrically connected to the handle layer, the first portion of the first layer of semiconductor material of the respective shunting region underlying the doped region.

12. The device package of claim 11, wherein the second portion of the first layer of semiconductor material of the device region underlies the first semiconductor device.

13. The device package of claim 11, wherein each shunting region includes an isolation region between the doped region and the first semiconductor device, wherein:
the isolation region laterally isolates the doped region; and
a depth of the isolation region is greater than a depth of the doped region.

14. The device package of claim 13, further comprising a deep isolation region in the substrate, the deep isolation region including a conductive material in contact with the handle layer, wherein the doped region is electrically connected to the conductive material.

15. The die structure of claim 1, wherein:
the first layer comprises a doped layer; and
the body region of the doped layer is contiguous with at least a portion of the doped layer underlying the semiconductor device of the plurality of semiconductor devices.

16. The die structure of claim 15, wherein:
a dopant concentration of the doped region is greater than a dopant concentration of the doped layer;
the doped region and the doped layer have the same conductivity type; and
the body region and the portion of the doped layer have the same conductivity.

17. The die structure of claim 1, wherein the doped region and the body region provide a resistive path from the portion of the first layer underlying the semiconductor device to the handle layer.

18. The die structure of claim 1, wherein the body region is integral with the portion of the first layer underlying the semiconductor device.

19. The die structure of claim 1, the plurality of semiconductor devices being formed on a device region of the first layer, wherein the body regions of the plurality of shunting regions are adjacent to the device region.

* * * * *